(12) United States Patent
Xu et al.

(10) Patent No.: US 9,627,451 B2
(45) Date of Patent: Apr. 18, 2017

(54) PIXEL STRUCTURE AND DISPLAY APPARATUS

(71) Applicant: EVERDISPLAY OPTRONICS (SHANGHAI) LIMITED, Shanghai (CN)

(72) Inventors: Xiaoli Xu, Shanghai (CN); Nana Xiong, Shanghai (CN)

(73) Assignee: EverDisplay Optronics (Shanghai) Limited, Shanghai (CN)

(*) Notice: Subject to any disclaimer, the term of this patent is extended or adjusted under 35 U.S.C. 154(b) by 0 days.

(21) Appl. No.: 15/079,358

(22) Filed: Mar. 24, 2016

(65) Prior Publication Data
US 2016/0293679 A1  Oct. 6, 2016

(30) Foreign Application Priority Data
Mar. 31, 2015  (CN) .......................... 2015 1 0149476

(51) Int. Cl.
*H01L 27/32* (2006.01)
*G09G 3/3225* (2016.01)

(52) U.S. Cl.
CPC ....... *H01L 27/3218* (2013.01); *G09G 3/3225* (2013.01); *H01L 27/3216* (2013.01); *G09G 2300/0452* (2013.01); *G09G 2320/0666* (2013.01)

(58) Field of Classification Search
CPC ............ H01L 27/3218; H01L 27/3216; G09G 3/3225
See application file for complete search history.

(56) References Cited

U.S. PATENT DOCUMENTS

| 2004/0080479 A1* | 4/2004 | Credelle | G02F 1/133514 345/88 |
| 2006/0170712 A1* | 8/2006 | Miller | H01L 27/3218 345/695 |
| 2016/0117969 A1* | 4/2016 | Qin | G09G 3/2003 345/694 |

* cited by examiner

*Primary Examiner* — Karen Kusumakar
(74) *Attorney, Agent, or Firm* — Yunling Ren

(57) ABSTRACT

A pixel structure includes a plurality of pixel cells each including two sub-pixel cells. Each of the two sub-pixel cell includes: a first sub-pixel; and at least two second sub-pixels parallelly adjacent to each other. Herein, organic material parts of the at least two second sub-pixels are interconnected and the first sub-pixel is arranged staggered with any of the at least two second sub-pixels in both a first direction and a second direction, and the first direction is perpendicular to the second direction.

16 Claims, 9 Drawing Sheets

PIXEL STRUCTURE AND DISPLAY APPARATUS

CROSS REFERENCE TO RELATED APPLICATION

This application is based on and claims priority to Chinese Patent Application No. 201510149476.6, filed on Mar. 31, 2015, the entire contents of which are incorporated herein by reference.

TECHNICAL FIELD

The present disclosure relates to the field of display technologies, and more particularly, to a pixel structure and a display apparatus.

BACKGROUND

An organic light-emitting diode (OLED) is bright in color, high in luminous efficiency, light in weight, wide in view angle, fast in response speed, and available from flexible preparation, and thus belongs to a new generation display technology following after LCD (Liquid Crystal Display). Unlike an LCD which needs a thick backlight, and thus has great visibility and high brightness, an OLED is featured by autoluminescence. According to drive modes, OLEDs can be classified into PMOLED (Passive Matrix Organic Light Emitting Diode) and AMOLED (Active Matrix Organic Light Emitting Diode). It is easier for an AMOLED to realize a high brightness and a high resolution because there is no problem of a duty ratio and no limitation on the number of scan electrodes for driving the same.

Generally, resolution of AMOLED mainly depends on precision of a mask used for evaporation of organic light-emitting material in the manufacturing process of OLED, where an FMM (Fine Metal Mask) is typically used as the mask. As electronic equipment is demanding for high resolution and high brightness of display screens, the area of a single pixel is gradually decreased, and the distance between sub-pixels having the same color is reduced accordingly. Higher requirements are put forward for the precision of FMM required by evaporation of OLED if a traditional arrangement mode of pixels in LCD is stilled adopted. When the distance between sub-pixels having the same color is reduced, the spacing between mesh openings on FMM is decreased accordingly. However, relatively great technical difficulties exist in fabricating FMM with extremely small spacing between mesh openings due to limitation by characteristics of raw materials.

An AMOLED consists of multiple pixel units arranged in array, and a schematic diagram illustrating such pixel structure according to an exemplary embodiment is as shown in FIG. 1. Each pixel unit includes a red (R) sub-pixel, a green (G) sub-pixel and a blue (B) sub-pixel. Each pixel unit needs one corresponding pixel driving unit to drive it. Brightness of an OLED in each sub-pixel is controlled by a driving subunit. As shown in FIG. 2, which is a schematic diagram illustrating a pixel unit in a pixel structure driven by a pixel driving unit in a pixel driving circuit, three sub-pixels in the pixel unit are respectively driven by three driving subunits 01, 02 and 03. Therefore, each pixel unit needs three driving subunits to drive it to implement color mixing of various pixels. Further, each driving subunit at least consists of a storage capacitor, a drive transistor and at least one switch transistor. Taking a typical 2T1C pixel drive circuit consists of TFTs (Thin Film Transistor) as an example, the schematic diagram illustrating an equivalent circuit of a 2T1C driving subunit is as shown in FIG. 3. In FIG. 3, $M_S$ is a switch transistor configured to control input of data line voltage; a grid electrode of $M_S$ is connected to a scanning line Sn, a source electrode or a drain electrode of $M_S$ is connected to a data line Data. $M_D$ is a drive transistor configured to control luminescence current of the OLED. $C_S$ is a storage capacitor configured to provide bias voltage and maintaining voltage for the grid electrode of the drive transistor $M_D$, which can play a role in continuous power supply and ensuring continuous luminescence of various pixels. ELVDD is operating voltage, ELVSS is source voltage, and IOLED is working current of the drive transistor $M_D$.

As electronic equipment is in pursuit of high resolution and high brightness of the display screen, the area of a single pixel is gradually decreased, and the distance between sub-pixels having the same color is reduced accordingly. In view of difficulties in fabricating an FMM screen and diffusion of organic light-emitting materials in evaporation process of OLED, higher requirements are put forward for FMM required by evaporation of the OLED since certain difficulties exist in achieving closely adjacent strip-shaped OLED sub-pixels having the same color as shown in FIG. 1. On the other hand, the gradually decreased area of pixel may impose restriction on design and layout of a driving circuit in the backplate due to limitation by precision of etching process.

Therefore, certain difficulties exist in achieving closely adjacent strip-shaped sub-pixels having the same color due to limitations of difficulties in fabricating the mask and of the process in evaporation procedure, thereby restricting an arrangement mode of OLED pixels.

The foregoing information is merely disclosed to facilitate understanding of background of the present disclosure. Therefore, the foregoing information may include information not constituting the prior art known to those of ordinary skill in the art.

SUMMARY

The present disclosure is directed to provide a pixel structure and a display apparatus.

According to one aspect of the present disclosure, there is provided a pixel structure, including a plurality of pixel cells each including two sub-pixel cells, and each of the two sub-pixel cell includes:

a first sub-pixel; and at least two second sub-pixels parallelly adjacent to each other, and organic material parts of the at least two second sub-pixels are connected with each other;

the first sub-pixel is arranged staggered with any of the at least two second sub-pixels in both a first direction and a second direction, and the first direction is perpendicular to the second direction.

According to another aspect of the disclosure, there is also provided a display apparatus, including a pixel driving circuit and the pixel structure as described above. The pixel driving circuit includes a plurality of pixel driving modules, the pixel driving module includes two sub-pixel driving modules configured to drive the sub-pixel cells in the pixel structure, and the sub-pixel driving module includes:

a first driving submodule configured to drive the first sub-pixel; and a second driving submodule configured to drive the at least two second sub-pixels parallelly adjacent to each other.

BRIEF DESCRIPTION OF THE DRAWINGS

By referring to detailed description of the drawings and exemplary embodiments, the foregoing and other characteristics and advantages of the present disclosure will become more apparent.

DETAILED DESCRIPTION

Typical embodiments presenting features and advantages of the present disclosure will be described in detail in the following description. It is to be understood that various modifications may be made on different embodiments of the present disclosure without departing from the scope of the present disclosure. The description and accompanying drawings therein are substantially used for illustrating but not intended for limiting the present disclosure.

In order to solve the foregoing problem, several embodiments are provided as below to explain and describe the present disclosure.

Embodiment I

This embodiment provides a pixel structure, including a plurality of pixel cells arranged in a matrix form, where each of the pixel cells includes:

a first sub-pixel 100; and at least two second sub-pixels 200 parallelly adjacent to each other, and organic material parts of the at least two second sub-pixels 200 are connected with each other.

In an embodiment, the first sub-pixel 100 is arranged staggered with any of the at least two second sub-pixels 200 in both a first direction and a second direction, and the first direction is perpendicular to the second direction. For example, the first direction is lengthwise direction of the second sub-pixels and the second direction is widthwise direction thereof, or vice versa, and the present disclosure is not limited thereto.

The second sub-pixel in the pixel cell corresponds to an electrode formed by etching an integrally-molded organic material part. In other words, a process for forming the second sub-pixel includes following steps. In the first step, an electrode is formed by means of etching; in the second step, an OLED organic material part is evaporated by using FMM; and in the third step, a common electrode for all of the OLEDs is evaporated. After the first step, at least two independent electrodes are formed by etching the second sub-pixel, then a red or blue organic material layer is formed on a substrate through evaporation using the mask. Although the organic material part is molded in one piece, two independent OLEDs, i.e., corresponding second sub-pixels, can be defined by two independent electrodes formed in the first step. Thus, two second sub-pixels in a sub-pixel cell respectively correspond to two electrodes. Therefore, the organic material part for the second sub-pixels having the same color and being parallelly adjacent to each other is integrally-molded, and a common opening on the single mask is used for evaporation. In this way, a spacing between sub-pixels having the same color can be enlarged, and difficulties in fabricating the mask are solved. Although multiple second sub-pixels are defined by one electrode of the OLEDs prepared by means of the etching process, no technological difficulty exists in the etching process, thus it is possible to implement tightly adjacent distribution of sub-pixels having the same color.

Figure 4:
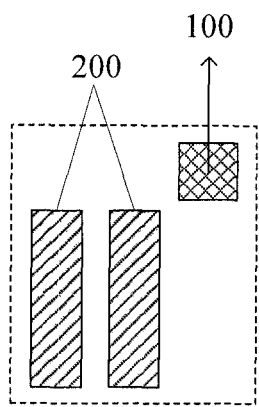
FIG. 4 is a schematic diagram illustrating a pixel structure according to Embodiment I of the present disclosure.

Taking two parallelly adjacent second sub-pixels 200 as an example, a schematic diagram illustrating the corresponding pixel structure is as shown in FIG. 4. In an embodiment, the first sub-pixel 100 may have a color of green, and the second sub-pixels 200 may have a color of red or blue. Owing to development trend for high resolution of AMOLED display technology and the characteristic that human eyes are more sensitive to green color and less sensitive to red or blue color, both two adjacent sub-pixel cells have green sub-pixels as a colored sub-pixel. There may be two types of sub-pixel cells in the pixel structure: one type of sub-pixel cell includes two red sub-pixels parallelly adjacent to each other and one green sub-pixel; the other type of sub-pixel cell includes two blue sub-pixels parallelly adjacent to each other and one green sub-pixel. The two types of sub-pixel cells are adjacent to each other in a row direction or a column direction, jointly constituting a pixel cell (or referred to as a repetitive cell). In other words, one sub-pixel cell in a pixel cell adopts a sub-pixel (s), included in the other sub-pixel cell adjacent thereto, with a color that is not included in the present sub-pixel cell to form three primary colors.

According to an exemplary embodiment of the present disclosure, in each of the sub-pixel cells, the number of the second sub-pixels is at least twice as many as that of the first sub-pixel. Furthermore, light emitting from all of the second sub-pixels and the first sub-pixel in each of the sub-pixel cells, when they are lightened, can be mixed into white light.

In an embodiment, a sum of areas of all the second sub-pixels in each of the sub-pixel cells is at least twice as many as an area of the first sub-pixel therein. Taking FIG. 4 as an example, a sub-pixel cell includes two red second sub-pixels and one green first sub-pixel. In an embodiment, for the whole pixel structure, the sum of the areas of the second sub-pixels having the same color is exactly equal to the area of the first sub-pixel. For an sub-pixel cell, however, the sum of the areas of the two red sub-pixels is greater than the area of the green sub-pixel, since the sub-pixel cell needs to be combined with a color (i.e., blue) lacked in three primary colors from another sub-pixel cell adjacent thereto for cooperative display. As in any one of the two sub-pixel cell, the total numbers of the red or blue sub-pixels are twice that of the green sub-pixels. Therefore, in two sub-pixel cells, the total number of the green sub-pixels is equal to that of the red sub-pixels and of the blue sub-pixels. However, it should be noted that "the sum of the areas of the second sub-pixels is exactly equal to the area of the first sub-pixel" in this embodiment is merely an exemplary description, any modification is possible as long as white light can be generated through light mixing. The specific numerical value of the areas depends on luminous efficiency of the OLEDs with various colors and control signals, and is not particularly limited in this embodiment.

According to another exemplary embodiment of the present disclosure, referring to FIG. 4, the first sub-pixel 100 is shaped like a square, and the second sub-pixel 200 is shaped like a strip. It should be noted, however, the size or shape is not limited to the embodiment. FIG. 4 shows merely an example. In a practical design, shapes and areas of the first sub-pixel and the second sub-pixel can be adjusted as required, so as to enlarge a distance between sub-pixels having the same color as much as possible and thus to reduce the difficulty in fabricating a mask.

The pixel cells in the pixel structure can be aligned and arranged in the form of rows or columns, or staggered and arranged in the form of rows or columns. Moreover, the second sub-pixels in one of two adjacent sub-pixel cells in a pixel cell are different in color from the second sub-pixels in another one of the two sub-pixel cells. Accordingly, distribution of the pixel cells in the pixel structure may be described through the following three implementation modes.

Figure 5:
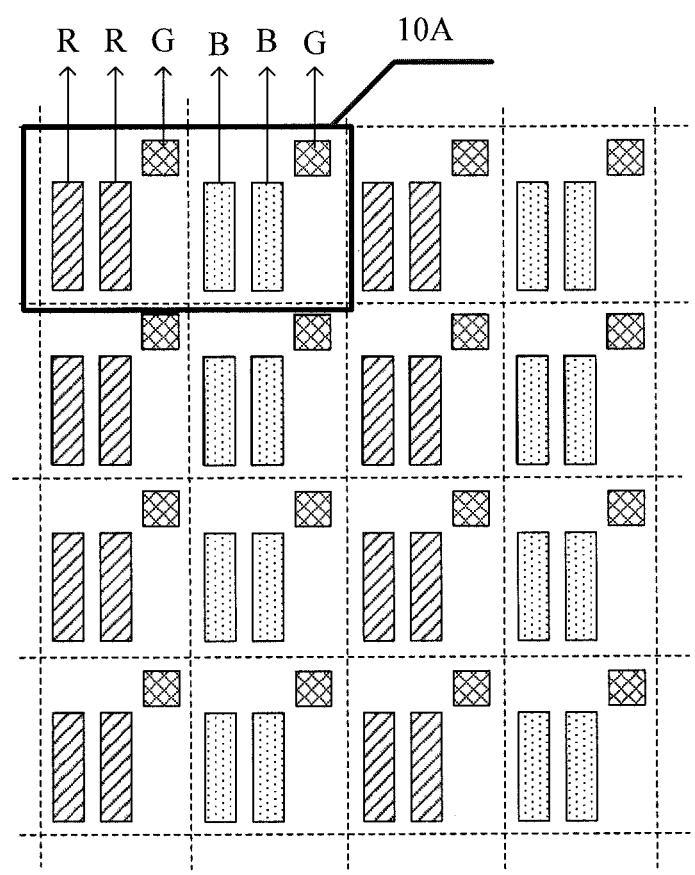
FIG. 5 is a schematic diagram illustrating a distributed implementation scheme I of pixel units in the pixel structure according to Embodiment I of the present disclosure.

In the first implementation mode, the second sub-pixels in a sub-pixel cell are different in color from the second sub-pixels in another sub-pixel cell adjacent thereto in a row direction. In other words, pixel cells 10A are aligned and arranged in the form of rows, as exemplary illustrated in FIG. 5. Accordingly, the distribution of pixel cells in a row is repeated in a pattern including a cell of red-green combination, then a cell of blue-green combination, another cell of red-green combination and then another cell of blue-green combination, while the distribution of pixel cells in column direction is repeated in a pattern including a column of red-green combination and then a column of blue-green combination.

Figure 6:
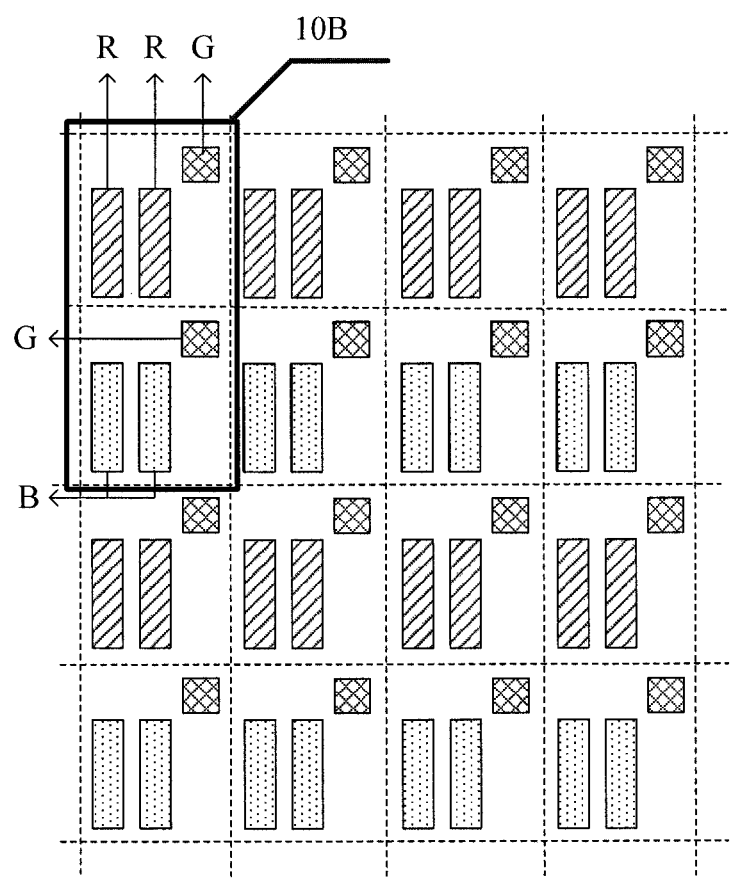
FIG. 6 is a schematic diagram illustrating a distributed implementation scheme II of pixel units in the pixel structure according to Embodiment I of the present disclosure.

In the second implementation mode, the second sub-pixels in a sub-pixel cell are different in color from the second sub-pixels in another sub-pixel cell adjacent thereto in a column direction. In other words, pixel cells 10B are aligned and arranged in the form of columns, as exemplary illustrated in FIG. 6. Accordingly, the distribution of pixel cells in a column is repeated in a pattern including a cell of red-green combination, then a cell of blue-green combination, another cell of red-green combination and then another cell of blue-green combination, while the distribution of pixel cells in row direction is repeated in a pattern including a row of red-green combination and then a row of blue-green combination.

Figure 7:
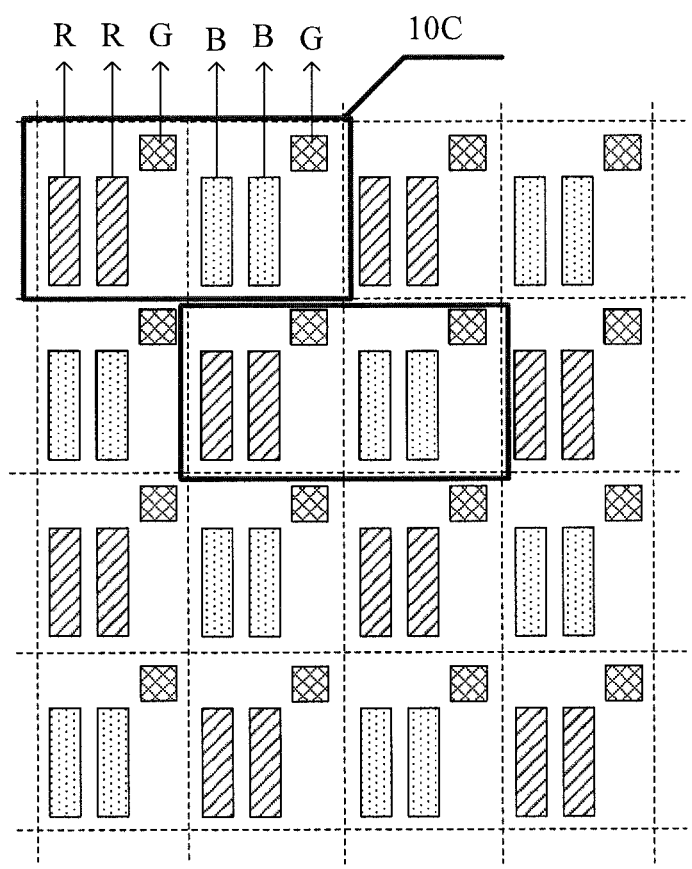
FIG. 7 is a schematic diagram illustrating a distributed implementation scheme III of pixel units in the pixel structure according to Embodiment I of the present disclosure.

In the third implementation mode, the second sub-pixels in a sub-pixel cell are different in color from the second sub-pixels in another sub-pixel cell adjacent thereto in both row and column directions. In other words, pixel cells 10C are staggered and arranged in the form of rows, as exemplary illustrated in FIG. 7. Accordingly, every sub-pixel cell of red-green combination is adjacent to a sub-pixel cell of blue-green combination, and likewise, every sub-pixel cell of blue-green combination is adjacent to a sub-pixel cell of red-green combination. In an embodiment, the third implementation mode can be applied to ensure more even distribution of colors. Likewise, a structure of the pixel cells staggered and arranged in the form of columns is similar to FIG. 7 with the same principle, which is not repeated herein.

As can be seen from above, in the process of preparing the OLED by means of evaporation using organic material, only one opening on the mask is used for evaporation of at least two adjacent second sub-pixels having the same color, and the second sub-pixels are independent of each other by forming a shape of electrode through the etching process before the evaporation. In this way, a technical problem that it is difficult to fabricate openings on the mask can be solved. Furthermore, no technical difficulty exists in the etching process for preparing the OLED electrode, so, sub-pixels having the same color can be formed as being more closely adjacent to each other. Accordingly, product yield can be improved, and an OLED product with relatively high definition can be realized.

Embodiment II

This embodiment further provides a display apparatus, including a pixel driving circuit and the pixel structure according to the foregoing Embodiment I. Herein, the pixel driving circuit includes multiple pixel driving modules, the pixel driving module includes two sub-pixel driving modules configured to drive the sub-pixel cells in the pixel structure, and the sub-pixel driving module includes:

a first driving submodule, configured to drive the first sub-pixel; and a second driving submodule, configured to simultaneously drive the at least two second sub-pixels parallelly adjacent to each other.

According to an exemplary embodiment of the present disclosure, each of the first driving submodule and the second driving submodule is provided with a drive transistor. Herein, the drive transistor in the first driving submodule is configured to drive an OLED in the first sub-pixel, while the drive transistor in the second driving submodule is configured to drive at least two OLEDs corresponding to the at least two second sub-pixels parallelly adjacent to each other.

Figure 8:
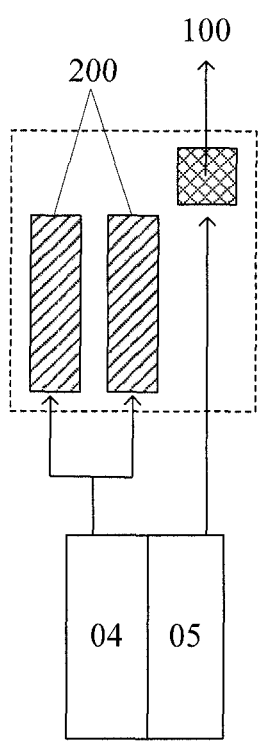
FIG. 8 is a schematic diagram illustrating a pixel unit in a pixel structure driven by a pixel driving unit in a pixel driving circuit according to Embodiment II of the present disclosure.

In this embodiment, taking an example where the pixel structure includes two second sub-pixels, as shown in FIG. 8, which is a schematic diagram illustrating a sub-pixel cell in the pixel structure driven by a sub-pixel driving module in a corresponding pixel driving circuit, two second sub-pixels 200 are commonly driven by a second driving submodule 04, and a first sub-pixel 100 is driven by a first driving submodule 05. Compared with the related art where each sub-pixel generally needs to be driven by one corresponding driving submodule, in this embodiment, although there are also three sub-pixel cells, two adjacent sub-pixels having the same color only need to be driven by a single driving submodule. In this way, the number of driving submodules can be reduced, thus more wiring space is available.

Figure 1:
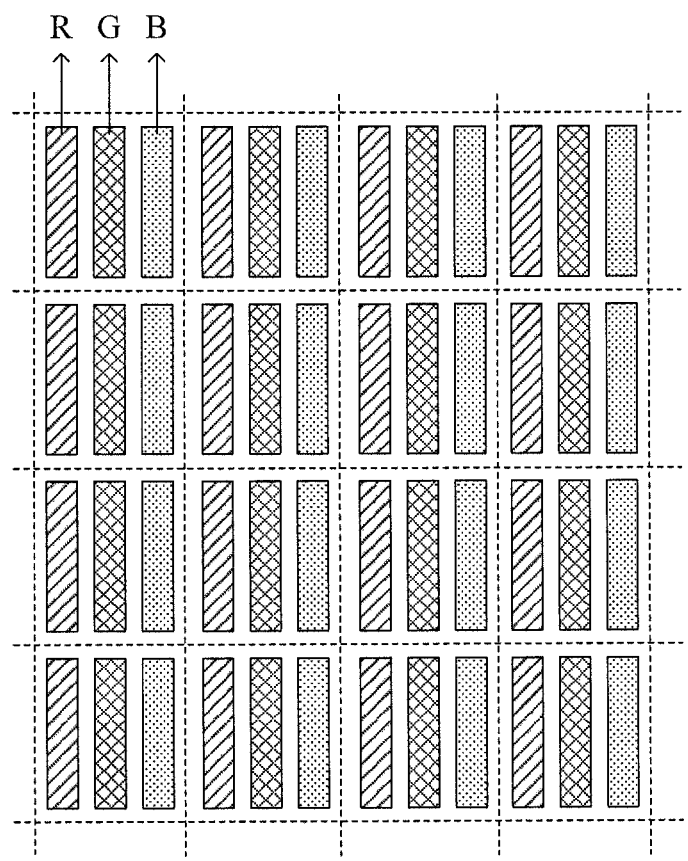
FIG. 1 is a schematic diagram illustrating a pixel structure according to an exemplary embodiment in related art.
Figure 2:
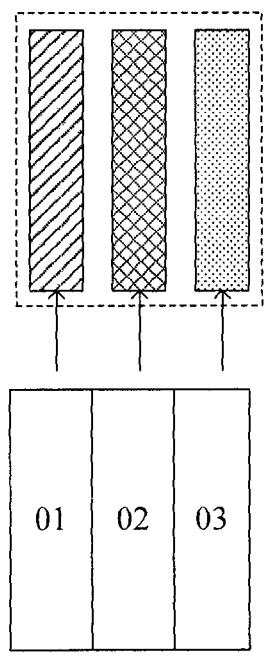
FIG. 2 is a schematic diagram illustrating a pixel unit in a pixel structure driven by a pixel driving unit in a pixel driving circuit according to an exemplary embodiment in related art.
Figure 3:
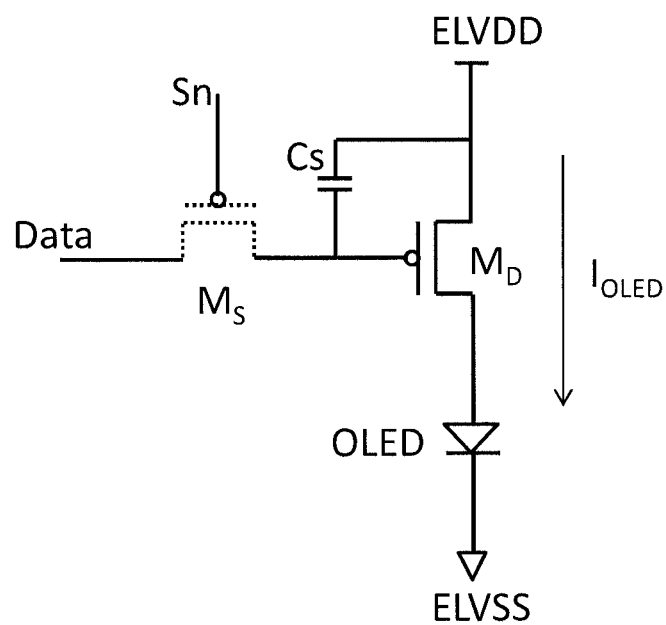
FIG. 3 is a schematic diagram illustrating an equivalent circuit of a 2T1C driving subunit according to an exemplary embodiment in related art.
Figure 9:
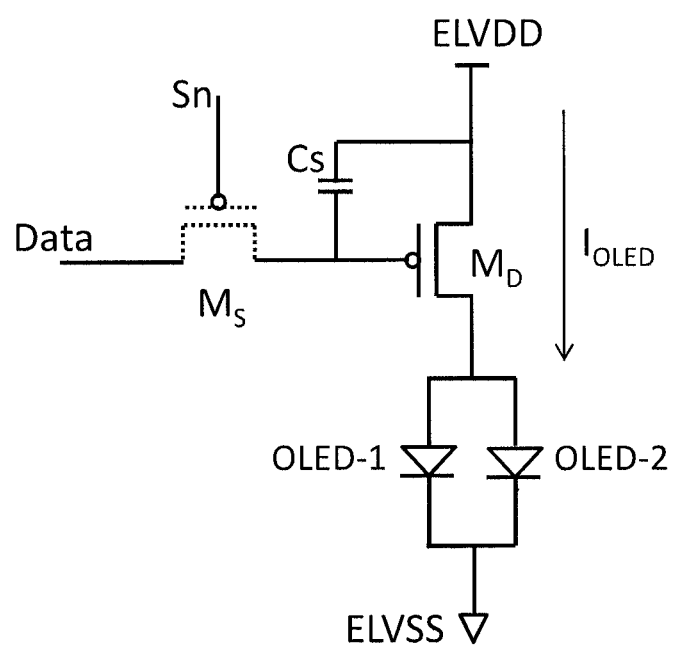
FIG. 9 is a schematic diagram illustrating an equivalent circuit of a second driving subunit according to Embodiment II of the present disclosure.

According to an exemplary embodiment of the present disclosure, each driving submodule (i.e., each of the first driving submodule 05 and the second driving submodule 04) not only includes a drive transistor, but also includes a storage capacitor and a switch transistor. As shown in FIG. 9, which is a schematic diagram illustrating an equivalent circuit of the second driving submodule 04 in the pixel driving module according to the embodiment, the equivalent circuit is implemented as a 2T1C-type circuit including a drive transistor $M_D$, a switch transistor $M_S$ and a storage capacitor $C_S$. Herein, there are two OLEDs, that is, OLED-1 and OLED-2, both of which may either be OLEDs emitting red light or OLEDs emitting blue light, commonly driven by the drive transistor $M_D$. The equivalent circuit of the first driving submodule 05 is the same as shown in FIG. 2, which is not repeated herein. 2T1C is relatively simple. In an embodiment, however, in order to compensate for stability of a TFT and to refresh the OLED, a drive circuit with more complex structure, for example, an nTmC (where n>3, m is>1), can be used, which is not enumerated herein.

As can be seen from above, sub-pixels having the same color are disposed adjacently, such that the number of driving submodule provided in the pixel driving module can be reduced according to the embodiment. In this way, one driving submodule can be eliminated in design, such that not only cost can be saved, but also more wiring space can be provided for the pixel circuit on backplate. Accordingly, product yield can be improved and AMOLED products with higher definition can be achieved.

It should be noted by those skilled in the art that any change or modification made without departing from the scope and the spirit of the present invention disclosed by the claims appended in the present disclosure shall fall within the protection scope of the claims in the present disclosure.

What is claimed is:

1. A pixel structure, comprising a plurality of pixel cells, each of the plurality of pixel cells comprising two sub-pixel cells, and each of the two sub-pixel cell comprising:
   a first sub-pixel; and
   at least two second sub-pixels parallelly adjacent to each other, wherein organic material parts of the at least two second sub-pixels are interconnected;
   wherein, the first sub-pixel is arranged staggered with any of the at least two second sub-pixels in both a first direction and a second direction, and the first direction is perpendicular to the second direction.

2. The pixel structure of claim 1, wherein the at least two second sub-pixels in the sub-pixel cell respectively correspond to at least two electrodes.

3. The pixel structure of claim 2, wherein the organic material parts are molded in one piece, and the at least two electrodes are formed by etching the organic material parts.

4. The pixel structure of claim 1, wherein the first sub-pixel is a green sub-pixel, and the second sub-pixel is a red sub-pixel or a blue sub-pixel.

5. The pixel structure of claim 1, wherein an amount of the second sub-pixels is at least twice as many as an amount of the first sub-pixel in the sub-pixel cell.

6. The pixel structure of claim 5, wherein white light is generated through light mixing by lightening both the second sub-pixels and the first sub-pixel in the sub-pixel cell.

7. The pixel structure of claim 5, wherein a total area of the second sub-pixels in the sub-pixel cell is at least twice as many as an area of the first sub-pixel in the sub-pixel cell.

8. The pixel structure of claim 5, wherein a total area of the first sub-pixels emitting green light in the pixel cell is equal to a total area of the second sub-pixels emitting red light and to a total area of the second sub-pixels emitting blue light in the pixel cell.

9. The pixel structure of claim 1, wherein the first sub-pixel is in shape of a square, and the second sub-pixel is in shape of a strip.

10. The pixel structure of claim 1, wherein the pixel cells in the pixel structure are aligned and arranged in form of rows or columns, or staggered and arranged in form of rows or columns.

11. The pixel structure of claim 10, wherein, for any one of the pixel cells, the second sub-pixels in one of the two sub-pixel cells are different in color from the second sub-pixels in another one of the two sub-pixel cells.

12. The pixel structure of claim 11, wherein the second sub-pixels in a first sub-pixel cell are different in color from the second sub-pixels in a second sub-pixel cell adjacent to the first sub-pixel cell in a row direction.

13. The pixel structure of claim 11, wherein the second sub-pixels in a first sub-pixel cell are different in color from the second sub-pixels in a second sub-pixel cell adjacent to the first sub-pixel cell in a column direction.

14. The pixel structure of claim 11, wherein the second sub-pixels in a first sub-pixel cell are different in color from the second sub-pixels in a second sub-pixel cell adjacent to the first sub-pixel cell in a row direction and the second sub-pixels in a third sub-pixel cell adjacent to the first sub-pixel cell in a column direction.

15. A display apparatus, comprising a pixel driving circuit and the pixel structure of claim 1, the pixel driving circuit comprising a plurality of pixel driving modules, wherein the pixel driving module comprises two sub-pixel driving modules configured to drive the sub-pixel cells in the pixel structure, and the sub-pixel driving module comprises:
   a first driving submodule configured to drive the first sub-pixel; and
   a second driving submodule configured to drive the at least two second sub-pixels parallelly adjacent to each other.

16. The display apparatus of claim 15, wherein each of the first and second driving submodules is provided with a drive transistor;
   the drive transistor in the first driving submodule is configured to drive an organic light-emitting diode in the first sub-pixel; and
   the drive transistor in the second driving submodule is configured to drive at least two organic light-emitting diodes corresponding to the at least two second sub-pixels parallelly adjacent to each other.

* * * * *